(12) United States Patent
Reams

(10) Patent No.: US 9,830,927 B2
(45) Date of Patent: Nov. 28, 2017

(54) SYSTEM AND METHOD FOR DECORRELATING AUDIO DATA

(71) Applicant: Psyx Research, Inc., Irvine, CA (US)

(72) Inventor: Robert W. Reams, Bellevue, WA (US)

(73) Assignee: PSYX RESEARCH, INC., Irvine, CA (US)

( * ) Notice: Subject to any disclaimer, the term of this patent is extended or adjusted under 35 U.S.C. 154(b) by 0 days.

(21) Appl. No.: 14/863,376

(22) Filed: Sep. 23, 2015

(65) Prior Publication Data
US 2016/0173979 A1   Jun. 16, 2016

Related U.S. Application Data

(60) Provisional application No. 62/092,603, filed on Dec. 16, 2014, provisional application No. 62/133,167, (Continued)

(51) Int. Cl.
*G10L 21/034* (2013.01)
*H04S 3/02* (2006.01)
(Continued)

(52) U.S. Cl.
CPC ........... *G10L 21/034* (2013.01); *G10L 19/02* (2013.01); *G10L 19/028* (2013.01); *G10L 21/02* (2013.01); *G10L 21/0205* (2013.01); *G10L 25/06* (2013.01); *H04N 5/52* (2013.01); *H04N 5/60* (2013.01); *H04N 21/439* (2013.01); *H04R 3/00* (2013.01); *H04R 25/356* (2013.01); *H04R 25/505* (2013.01); *H04S 3/02* (2013.01); *H03G 5/165* (2013.01); *H04R 3/14* (2013.01); *H04R 2225/43* (2013.01); *H04R 2420/01* (2013.01)

(58) Field of Classification Search
CPC .................................................. G10L 21/034
USPC ....... 375/146, 241; 381/17, 20, 63, 94.3, 97, 381/98, 119, 1, 57, 58, 92, 107, 120; 704/504; 709/229; 370/286; 455/24; 700/94
See application file for complete search history.

(56) References Cited

U.S. PATENT DOCUMENTS 5,953,049 A *  9/1999  Horn ........................ H04N 7/15
                                                    348/14.01
6,449,368 B1 *  9/2002  Davis ....................... H04S 1/002
                                                    381/1
(Continued)

FOREIGN PATENT DOCUMENTS

WO        2010/003556 A1     1/2010

OTHER PUBLICATIONS

The Invitation to pay additional fees and, where applicable, protest fee issued by EPO on Mar. 23, 2016 for International patent application No. PCT/US2015/065936.
(Continued)

*Primary Examiner* — Gerald Gauthier
(74) *Attorney, Agent, or Firm* — Jackson Walker LLP; Christopher J. Rourk

(57) ABSTRACT

A system for processing audio data comprising an audio data source. A delay system coupled to the audio data source and a delay input and configured to delay audio data provided by the audio data source by an amount of time equal to the delay input. A randomizer system coupled to the delay input and configured to generate an output that randomly changes as a function of time.

18 Claims, 2 Drawing Sheets

Related U.S. Application Data filed on Mar. 13, 2015, provisional application No. 62/156,061, filed on May 1, 2015, provisional application No. 62/156,065, filed on May 1, 2015.

(51) Int. Cl.

| | | |
|---|---|---|
| G10L 19/02 | (2013.01) | |
| G10L 21/02 | (2013.01) | |
| H04N 5/52 | (2006.01) | |
| H04N 5/60 | (2006.01) | |
| H04N 21/439 | (2011.01) | |
| G10L 25/06 | (2013.01) | |
| H04R 3/00 | (2006.01) | |
| H04R 25/00 | (2006.01) | |
| G10L 19/028 | (2013.01) | |
| H04R 3/14 | (2006.01) | |
| H03G 5/16 | (2006.01) | |

(56) References Cited

U.S. PATENT DOCUMENTS

| | | | |
|---|---|---|---|
| 6,760,448 B1* | 7/2004 | Gundry | H04S 3/02 381/20 |
| 7,046,812 B1* | 5/2006 | Kochanski | H04R 3/005 381/92 |
| 8,345,887 B1* | 1/2013 | Betbeder | G10H 1/0091 381/102 |
| 8,538,037 B2* | 9/2013 | Herre | G10L 19/008 379/406.14 |
| 8,666,732 B2* | 3/2014 | Sato | G10L 21/038 327/91 |
| 8,885,836 B2* | 11/2014 | McGrath | H04S 1/002 381/17 |
| 2002/0122468 A1* | 9/2002 | Belkerdid | H04B 1/707 375/146 |
| 2003/0233234 A1 | 12/2003 | Truman et al. | |
| 2004/0192202 A1* | 9/2004 | Novorita | H04M 9/082 455/24 |
| 2005/0053020 A1* | 3/2005 | Thirumoorthy | H04M 9/082 370/286 |
| 2005/0157883 A1* | 7/2005 | Herre | G10L 19/008 381/17 |
| 2005/0169482 A1* | 8/2005 | Reams | H04S 3/00 381/17 |
| 2006/0217975 A1 | 9/2006 | Sung et al. | |
| 2006/0280311 A1* | 12/2006 | Beckinger | H04S 3/00 381/17 |
| 2007/0223740 A1* | 9/2007 | Reams | G10L 19/008 381/119 |
| 2007/0297519 A1* | 12/2007 | Thompson | G10L 19/008 375/241 |
| 2008/0118084 A1* | 5/2008 | Moon | H04S 1/002 381/98 |
| 2009/0046871 A1* | 2/2009 | Oxford | H04S 7/306 381/98 |
| 2009/0052676 A1* | 2/2009 | Reams | H04S 5/00 381/1 |
| 2009/0271186 A1* | 10/2009 | LeBlanc | G10L 21/02 704/226 |
| 2010/0086141 A1* | 4/2010 | Nicolino, Jr. | H04R 5/04 381/57 |
| 2011/0026739 A1* | 2/2011 | Thomsen | H03F 1/3211 381/120 |
| 2011/0029109 A1* | 2/2011 | Thomsen | H03F 3/187 700/94 |
| 2012/0170756 A1* | 7/2012 | Kraemer | H04S 7/30 381/17 |
| 2013/0259245 A1* | 10/2013 | Cheng | H04R 3/00 381/58 |
| 2013/0262687 A1* | 10/2013 | Avery | G06F 9/54 709/229 |
| 2014/0185817 A1* | 7/2014 | Rodigast | G10K 15/08 381/63 |
| 2014/0211945 A1* | 7/2014 | Norimatsu | H04S 1/002 381/17 |
| 2014/0233762 A1* | 8/2014 | Vilkamo | G10H 1/183 381/119 |
| 2016/0173979 A1* | 6/2016 | Reams | G10L 19/028 381/97 |
| 2016/0180858 A1* | 6/2016 | Breebaart | G10L 19/008 704/504 |

OTHER PUBLICATIONS

Anonymous, "Dynamic range compression, Wikipedia, the free encyclopedia", 2003.
Anonymous, "Noise gates—Dynamics processors—Pro-Audio Basics", 2014.
The International Search report and Written Opinion dated May 31, 2016 for International patent application No. PCT/US2015/065936.
Ritchie, "MediaRenderer:1 Device Template Version 1.01", UPnPT™ Forum, Jun. 25, 2002, pp. 1-12.
Ritchie, "MediaServer:1 Device Template Version 1.01", UPnP™ Forum, Jun. 25, 2002, pp. 1-12.
Kou et al., "RenderingControl:1 Service Template Version 1.01", UPnP™ Forum, Jun. 25, 2002, pp. 1-63.
Lawrence, "Basic:1.0 Device Definition Version 1.0", UPnP™ Forum, Dec. 12, 2002, pp. 1-7.
Stickler et al., "HVAC_System:1 Device Template", UPnP™ Forum, May 13, 2003, pp. 1-8.
"Universal Plug and Play Device Architecture", Jun. 8, 2000, ver. 1.0, pp. 1-54.
Miller et al., "UPnP Forum AV:4 Overview", UPnP™ Forum, 2012, pp. 1-45.
Ritchie et al., "UPnP AV Architecture:1", UPnP™ Forum, Jun. 25, 2002, pp. 1-22.
Buerl et al., "AVTransport:1 Service Template Version 1.01", UPnP™ Forum, Jun. 25, 2002, pp. 1-67.
Chan et al., "ConnectionManager:1 Service Template Version 1.01", UPnP™ Forum, Jun. 25, 2002, pp. 1-25.
Debique et al., "ContentDirectory:1 Service Template Version 1.01", UPnP™ Forum, Jun. 25, 2002, pp. 1-89.
The International Preliminary Report on Patentability issued by the International Bureau of WIPO dated Jun. 29, 2017 for International patent application No. PCT/US2015/065936.

* cited by examiner

SYSTEM AND METHOD FOR DECORRELATING AUDIO DATA

RELATED APPLICATIONS

The present application claims priority to and benefit of U.S. Provisional Patent Application No. 62/092,603, filed on Dec. 16, 2014, U.S. Provisional Patent Application No. 62/133,167, filed on Mar. 13, 2015, U.S. Provisional Patent Application No. 62/156,061, filed on May 1, 2015, and U.S. Provisional Patent Application No. 62/156,065, filed on May 1, 2015, each of which are hereby incorporated by reference for all purposes as if set forth herein in their entirety.

TECHNICAL FIELD

The present disclosure relates generally to audio data processing, and more specifically to a system and method for decorrelating audio data that improves sound quality by providing kinocilia stimulation.

BACKGROUND OF THE INVENTION

"High-quality" audio data systems, such as digital audio data systems, can provide sound quality that is not as qualitatively good as other "low-quality" audio data systems, as that sound is experienced by a listener. The reasons for this discrepancy are unknown in the prior art.

SUMMARY OF THE INVENTION

A system for processing audio data is provided that includes an audio data source. A delay system is connected to the audio data source and a delay input, and is configured to delay audio data provided by the audio data source by an amount of time equal to the delay input. A randomizer system connected to the delay input generates an output that randomly changes as a function of time, such that this output can be used to randomly vary the delay.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE SEVERAL VIEWS OF THE DRAWINGS

Aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views, and in which.

DETAILED DESCRIPTION OF THE INVENTION

Figure 1:
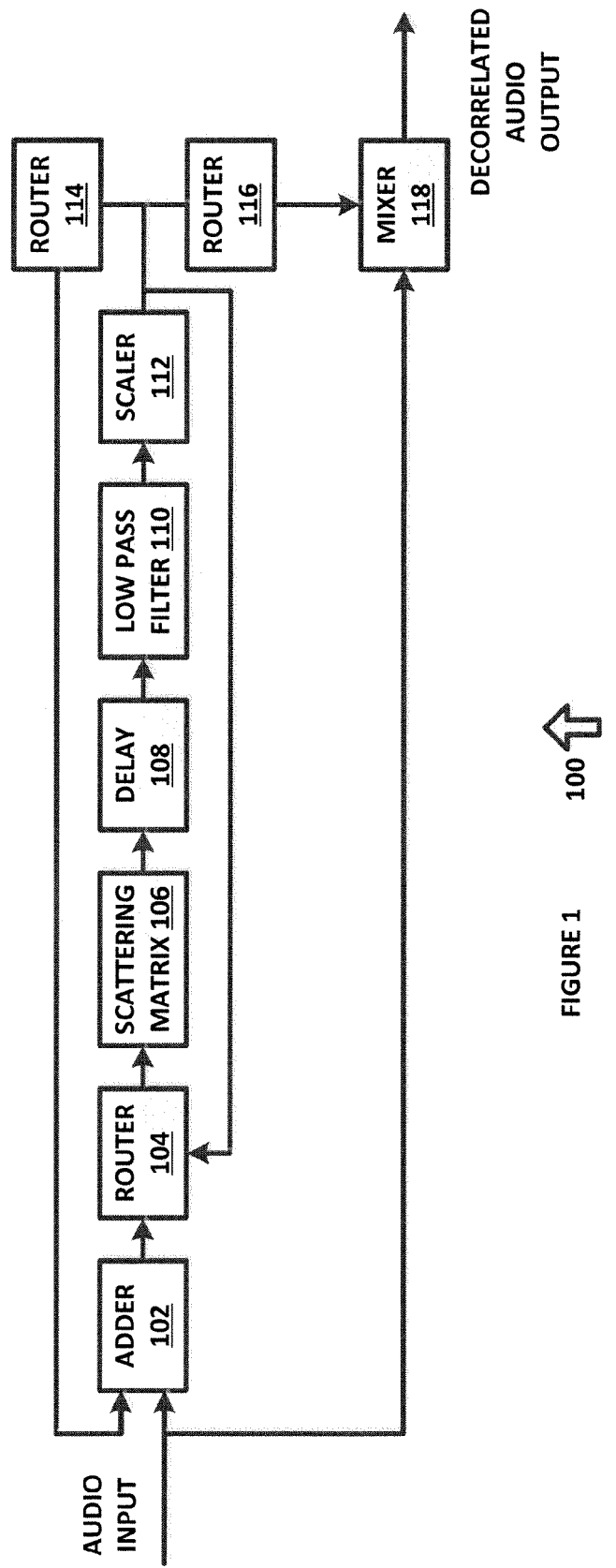
FIG. 1 is a diagram of a system for decorrelating audio in accordance with an exemplary embodiment of the present disclosure.

In the description that follows, like parts are marked throughout the specification and drawings with the same reference numerals. The drawing figures might not be to scale and certain components can be shown in generalized or schematic form and identified by commercial designations in the interest of clarity and conciseness.

FIG. 1 is a diagram of a system 100 for decorrelating audio in accordance with an exemplary embodiment of the present disclosure. System 100 can be implemented in hardware or a suitable combination of hardware and software, and can be one or more software systems operating on a special purpose audio processor or other suitable devices.

As used herein, "hardware" can include a combination of discrete components, an integrated circuit, an application-specific integrated circuit, a field programmable gate array, or other suitable hardware. As used herein, "software" can include one or more objects, agents, threads, lines of code, subroutines, separate software applications, two or more lines of code or other suitable software structures operating in two or more software applications, on one or more processors (where a processor includes a microcomputer or other suitable controller, memory devices, input-output devices, displays, data input devices such as a keyboard or a mouse, peripherals such as printers and speakers, associated drivers, control cards, power sources, network devices, docking station devices, or other suitable devices operating under control of software systems in conjunction with the processor or other devices), or other suitable software structures. In one exemplary embodiment, software can include one or more lines of code or other suitable software structures operating in a general purpose software application, such as an operating system, and one or more lines of code or other suitable software structures operating in a specific purpose software application. As used herein, the term "couple" and its cognate terms, such as "couples" and "coupled," can include a physical connection (such as a copper conductor), a virtual connection (such as through randomly assigned memory locations of a data memory device), a logical connection (such as through logical gates of a semiconducting device), other suitable connections, or a suitable combination of such connections.

System 100 includes adder 102, which receives an input audio data stream and adds it to a feedback audio data stream. The output of adder 102 is provided to router 104, which routes the audio data to the inputs of scattering matrix 106. Scattering matrix 106 can utilize a full M-input×N-output mixer with a total of M×N coefficients. The coefficients can be contained in a coefficients matrix with the gain from the ith input to the jth output found at coeffs(i, j). In this exemplary embodiment, the coeffs array can be a one dimensional array of length M×N. The gain from input m (0<=m<=M−1) to output n (0<=n<=N−1) can be stored at coeffs[m+n*M]. In this manner, the first M coefficients can be the gains used to compute the first output channel. The next M coefficients can be the gains used to compute the second output channel, and so forth.

The output from scattering matrix 106 is provided to delay 108, which is a randomly variable delay. By introducing a randomly variable delay with less than 5 cents of variation, the audio data is decorrelated from other audio data as well as itself, such as to prevent the audio data from exciting resonance modes in chassis or other structures. The output of delay 108 is provided to low pass filter 110, which is then provided to scaler 112.

Scaler 112 is used to reduce the level of the decorrelated audio data to at least 13 dB below the unprocessed audio data, so that it is present in the audio data but not noticeable to a human listener. This effect is based on the observation that an audio content signal that is 13 dB or greater than associated an audio noise signal will effectively block the audio noise signal from being perceived by a listener. The output from scaler 112 is fed back to the input of router 104, as well as to router 114 and router 116. The output of router 114 is fed back to the input to adder 102, and the output of router 116 is fed to mixer 118, where it is mixed with the audio input signal.

In operation, system 100 receives and processes input digital audio data in the time domain to decorrelate the digital audio data, such as to combine overlay audio data that varies slightly from the input audio data with the input audio data to generate decorrelated output audio data. The decorrelated audio data is then combined with the unprocessed audio data at a level that is at least 13 decibels below the level of the unprocessed audio data, so as to cause the kinocilia to be stimulated at a sound level that is not perceived by the listener, but which nonetheless prevents the listener's kinocilia from becoming dormant, which would require additional audio energy to wake the kinocilia and which effectively masks low level audio data in the unprocessed audio data. Although time domain processing is disclosed, frequency domain components and processing can also or alternatively be used where suitable.

Figure 2:
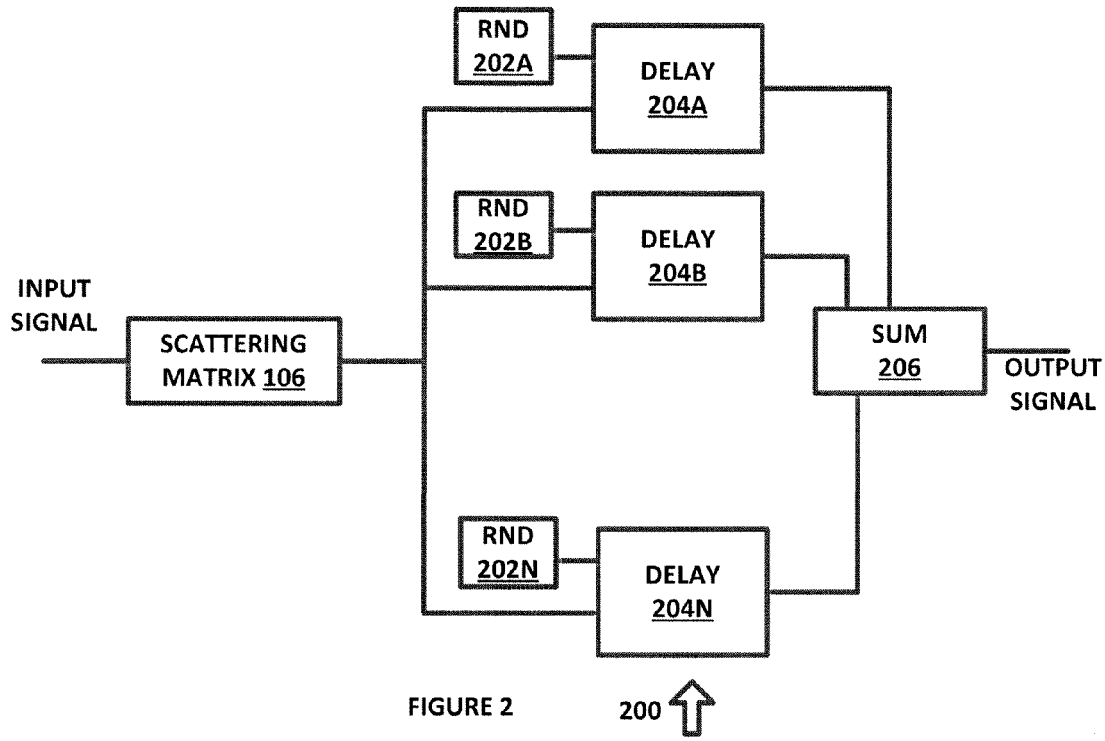
FIG. 2 is a diagram of an array of randomly variable delays in accordance with an exemplary embodiment of the present disclosure.

FIG. 2 is a diagram of an array 200 of randomly variable delays in accordance with an exemplary embodiment of the present disclosure. Array 200 receives the output of scattering matrix 106 into each of a plurality of delay units 204A through 204N, which each have an associated random input 202A through 202N. In one exemplary embodiment, each delay unit can be a $Z^{-N}$ delay unit, where the value of N is changed by an amount not exceeding 5 cents. The outputs of delays 204A through 204N are then summed at summer 206 to generate a decorrelated output signal.

Although a plurality of programmable delays 204A through 204N are shown with a plurality of random inputs, a single programmable delay with a single random input can be used, as long as the delay is truly randomized. When a non-random delay is used, patterns in the delay variation can be detectable to human hearing, or can otherwise excite resonant oscillation modes in speaker grills, enclosures or other structures.

Figure 3:
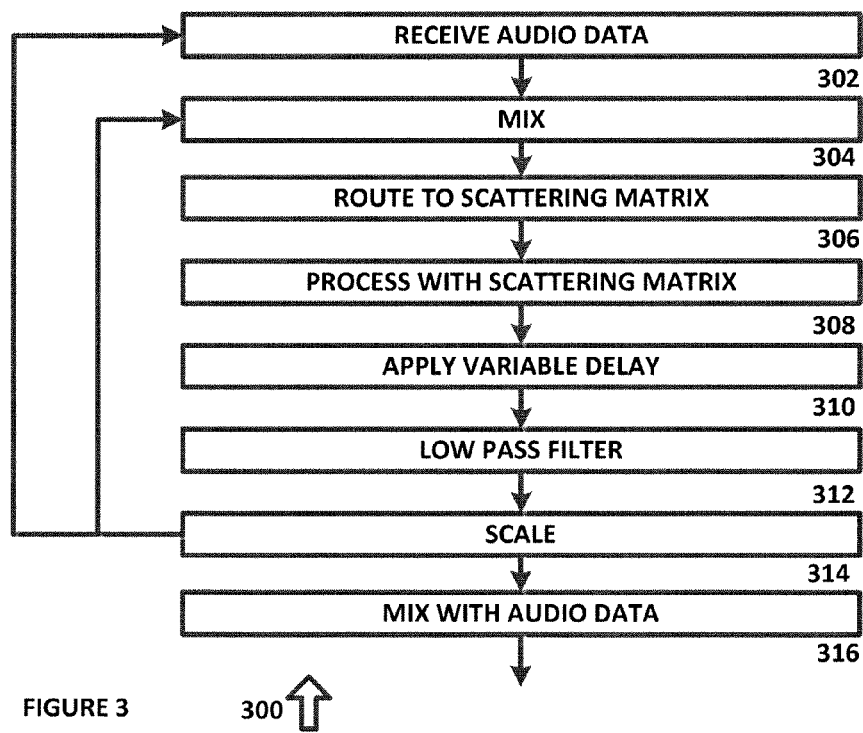
FIG. 3 is a diagram of an algorithm in accordance with an exemplary embodiment of the present disclosure.

FIG. 3 is a diagram of an algorithm 300 in accordance with an exemplary embodiment of the present disclosure. Algorithm 300 can be implemented in hardware or a suitable combination of hardware and software.

Algorithm 300 begins at 300, where audio data is received. In one exemplary embodiment, the audio data can be a single channel of audio data in a digital format that is received over a data port and buffered in a data memory, multiple channels of audio data in a digital format that are received in data packets having a multiple-channel format and which are processed to extract individual channels that are buffered into separate data memory locations, one or multiple channels of audio data in a predetermined analog format that are subsequently converted to a digital format using an analog to digital data processing system and buffered in a data memory, or other suitable forms of audio data. The algorithm then proceeds to 304.

At 304, the audio data is mixed with audio data that has been fed back after processing. In one exemplary embodiment, the mixing can be performed by simple addition of the two audio signals, or other suitable mixing processes can also or alternatively be used. The algorithm then proceeds to 306.

At 306, the mixed audio data is routed to a scattering matrix. In one exemplary embodiment, the audio data can be routed as different time samples, as redundant data streams or in other suitable manners. The algorithm then proceeds to 308.

At 308, the audio data is processed by the scattering matrix, such as in the manner discussed herein or in other suitable manners. The output of the scattering matrix can then be summed or reconstructed as suitable, and the algorithm proceeds to 310.

At 310, a variable delay is applied to the audio data. In one exemplary embodiment, the audio data can be processed using a $Z^{-N}$ transform, where the delay value is changed by an amount not exceeding 5 cents (0.416 percent). In one exemplary embodiment, the amount of delay can be limited to no more than an amount that is below a level at which human hearing can distinguish a change in a steady single frequency tone, so as to prevent the random variation from being noticeable. In one exemplary embodiment, the output of the scattering matric can be provided in parallel to a plurality of parallel programmable delays, which each have a distinct random variation to the amount of delay, and where the audio output data from each delay is then added together to form a single set of audio data, or other suitable processing can also or alternatively be used. The algorithm then proceeds to 312.

At 312, the audio data is processed by a low pass filter. In one exemplary embodiment, the low pass filter can have an 8 kilohertz cutoff frequency or other suitable frequencies, such as to extract higher frequency components where pitch variations are difficult to hear. The algorithm then proceeds to 314.

At 314 the audio data is processed by a scaler, such as to reduce the magnitude of the audio data prior to feeding the audio data back for processing at 302 and 304, for mixing with input audio data or for other suitable purposes. In one exemplary embodiment, the level can be sufficient to prevent kinocilia from becoming inactive for more than 200 milliseconds, because the amount of energy required to re-active kinocilia after they have become inactive can result in a reduction in the perceived quality of the audio data.

At 316, the audio data is mixed with the input audio data and is fed back for mixing at 302 and is also fed back for routing at 304. As discussed, the use of decorrelated audio that has been added into the original audio data can improve the sensitivity of kinocilia to the processed audio data by preventing the kinocilia from becoming dormant.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed is:

1. A system for processing audio data comprising:
   an audio data source;
   a delay system coupled to the audio data source and a delay input and configured to delay audio data provided by the audio data source by an amount of time equal to the delay input, producing decorrelated audio data; and
   a randomizer system coupled to the delay input and configured to generate an output that randomly changes as a function of time, wherein the randomizer system is configured to generate an output that randomly changes as a function of time by no more than 5 cents.

2. The system of claim 1 wherein the delay system comprises a $Z^{-N}$ transform delay.

3. The system of claim 1 wherein the delay system comprises a plurality of $Z^{-N}$ transform delays, where the value of N does not exceed a value of 5.

4. The system of claim 1 further comprising a scattering matrix coupled to the audio data source and the delay system.

5. The system of claim 1 further comprising an adder system coupled to the audio data source and to a feedback source derived from the delayed audio output.

6. The system of claim 1 further comprising a low pass filter coupled to a delay output of the delay system.

7. The system of claim 1 further comprising a scaler receiving the delayed audio data, scaling the audio data and providing the scaled and delayed audio data to a feedback path.

8. The system of claim 1 further comprising a mixer coupled to the audio data source and configured to receive the delayed audio data and to mix the delayed audio data with non-delayed audio data from the audio data source.

9. The system of claim 1 wherein the audio data source, the delay system and the randomizer system are digital data processing systems operating in the time domain.

10. A method for processing audio data comprising:
receiving encoded audio data at an audio processing system;
generating an output that randomly changes as a function of time; and
delaying the encoded audio data by an amount of time equal to the output, producing decorrelated audio data;
scaling the audio data; and
providing the scaled and delayed audio data to a feedback path.

11. The method of claim 10 wherein generating the output that randomly changes as a function of time comprises applying a $Z^{-N}$ transform delay, N is changeable to a value not to exceed 5 cents.

12. The method of claim 10 wherein generating the output that randomly changes as a function of time comprises applying a plurality of $Z^{-N}$ transform delays, N is changeable to a value not to exceed 5 cents.

13. The method of claim 10 further comprising processing the encoded audio data using a scattering matrix.

14. The method of claim 10 further comprising adding the encoded audio data to a feedback source derived from the delayed encoded audio output.

15. The method of claim 10 further comprising passing a low frequency component of the delayed encoded audio data.

16. The method of claim 10 further comprising mixing the delayed encoded audio data with non-delayed encoded audio data from an audio data source.

17. The method of claim 10 wherein generating an output that randomly changes as a function of time comprises generating an output that randomly changes as a function of time by no more than 5 cents.

18. A method for use in a system for processing audio data that includes an audio data source, a delay system having a plurality of Z—N delays coupled to the audio data source and a delay input and configured to delay audio data provided by the audio data source by an amount of time equal to the delay input, a randomizer system coupled to the delay input and configured to generate an output that randomly changes as a function of time, a scattering matrix coupled to the audio data source and the delay system, an adder system coupled to the audio data source and to a feedback source derived from the delayed audio output, a low pass filter coupled to a delay output of the delay system, a scaler receiving the delayed audio data, scaling the audio data and providing the scaled and delayed audio data to a feedback path, a mixer coupled to the audio data source and configured to receive the delayed audio data and to mix the delayed audio data with non-delayed audio data from the audio data source, wherein the audio data source, the delay system and the randomizer system are digital data processing systems operating in the time domain, and wherein the randomizer system is configured to generate an output that randomly changes as a function of time by no more than 5 cents, the method comprising:
receiving encoded audio data at an audio processing system;
generating an output that randomly changes as a function of time;
delaying the encoded audio data by an amount of time equal to the output, producing decorrelated audio data;
processing the encoded audio data using a scattering matrix;
adding the encoded audio data to a feedback source derived from the delayed encoded audio output;
passing a low frequency component of the delayed encoded audio data;
scaling the audio data;
providing the scaled and delayed audio data to a feedback path;
mixing the delayed encoded audio data with non-delayed encoded audio data from an audio data source;
wherein generating the output that randomly changes as a function of time comprises applying a $Z^{-N}$ transform delay;
wherein generating the output that randomly changes as a function of time comprises applying a plurality of $Z^{-N}$ transform delays; and
wherein generating an output that randomly changes as a function of time comprises generating an output that randomly changes as a function of time by no more than 5 cents.

* * * * *